United States Patent
Phatak et al.

(10) Patent No.: US 8,502,187 B2
(45) Date of Patent: *Aug. 6, 2013

(54) RESISTIVE SWITCHING MEMORY ELEMENT INCLUDING DOPED SILICON ELECTRODE

(75) Inventors: Prashant Phatak, San Jose, CA (US); Tony Chiang, Campbell, CA (US); Michael Miller, San Jose, CA (US); Wen Wu, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/454,392

(22) Filed: Apr. 24, 2012

(65) Prior Publication Data

US 2012/0205610 A1    Aug. 16, 2012

Related U.S. Application Data

(63) Continuation of application No. 12/608,934, filed on Oct. 29, 2009, now Pat. No. 8,183,553.

(60) Provisional application No. 61/168,534, filed on Apr. 10, 2009.

(51) Int. Cl.
*H01L 47/00* (2006.01)

(52) U.S. Cl.
USPC ........................................ 257/4; 257/E45.003

(58) Field of Classification Search
USPC ...... 257/2, 4, 5, 536, 537, E45.003; 365/148
See application file for complete search history.

(56) References Cited

U.S. PATENT DOCUMENTS 3,883,887 A * 5/1975 Robinson, Sr. ................. 345/80
8,183,553 B2 * 5/2012 Phatak et al. ..................... 257/4

* cited by examiner

*Primary Examiner* — Mark Prenty

(57) ABSTRACT

A resistive switching memory element including a doped silicon electrode is described, including a first electrode comprising doped silicon having a first work function, a second electrode having a second work function that is different from the first work function by between 0.1 and 1.0 electron volts (eV), a metal oxide layer between the first electrode and the second electrode, the metal oxide layer switches using bulk-mediated switching and has a bandgap of greater than 4 eV, and the memory element switches from a low resistance state to a high resistance state and vice versa.

18 Claims, 8 Drawing Sheets

RESISTIVE SWITCHING MEMORY ELEMENT INCLUDING DOPED SILICON ELECTRODE

PRIORITY CLAIM TO PROVISIONAL APPLICATION

This application is a continuation of U.S. application Ser. No. 12/608,934, entitled "RESISTIVE SWITCHING MEMORY ELEMENT INCLUDING DOPED SILICON ELECTRODE" and filed Oct. 29, 2009, now U.S. Pat. No. 8,183,553, which claims priority to U.S. Provisional Application No. 61/168,534 entitled "RESISTIVE SWITCHING MEMORY ELEMENT INCLUDING DOPED SILICON ELECTRODE" and filed on Apr. 10, 2009, both of which are incorporated herein by reference in their entirety.

FIELD OF THE INVENTION

The present invention relates generally to electronic memories. More specifically, resistive-switching memory elements including doped silicon electrodes are described.

BACKGROUND OF THE INVENTION

Non-volatile memories are semiconductor memories that retain their contents when unpowered. Non-volatile memories are used for storage in electronic devices such as digital cameras, cellular telephones, and music players, as well as in general computer systems, embedded systems and other electronic devices that require persistent storage. Non-volatile semiconductor memories can take the form of removable and portable memory cards or other memory modules, can be integrated into other types of circuits or devices, or can take any other desired form. Non-volatile semiconductor memories are becoming more prevalent because of their advantages of small size and persistence, having no moving parts, and requiring little power to operate.

Flash memory is a common type of non-volatile memory used in a variety of devices. Flash memory uses an architecture that can result in long access, erase, and write times. The operational speeds of electronic devices and storage demands of users are rapidly increasing. Flash memory is proving, in many instances, to be inadequate for non-volatile memory needs. Additionally, volatile memories (such as random access memory (RAM)) can potentially be replaced by non-volatile memories if the speeds of non-volatile memories are increased to meet the requirements for RAM and other applications currently using volatile memories.

Thus, what is needed is a new type of non-volatile memory. Memories that include elements which exhibit changes in resistive states in response to the application of voltages have been described. These memories typically have operational and durability limitations. Therefore, a resistive-switching memory with improved operational and durability characteristics is desired.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, resistive switching non-volatile memory elements are described. The memory elements described herein generally have a metal-insulator-semiconductor (MIS) structure, with one of the layers being a conductive doped silicon layer. The conductive layers are electrodes, while the insulating layers are switching metal oxides. The electrodes include one doped silicon electrode (e.g. doped polysilicon) that has a work function that is between 0.1 and 1.0 electron volts (eV) (or 0.4 to 0.6 eV, etc.) different from the other electrode. The switching metal oxide can include a higher bandgap (e.g. greater than 4 eV) material such as hafnium oxide, and optionally a coupling layer such as titanium oxide, zirconium oxide, or aluminum oxide. The coupling layer may further include a same metal as an adjacent electrode.

I. Memory Structure

Figure 1:
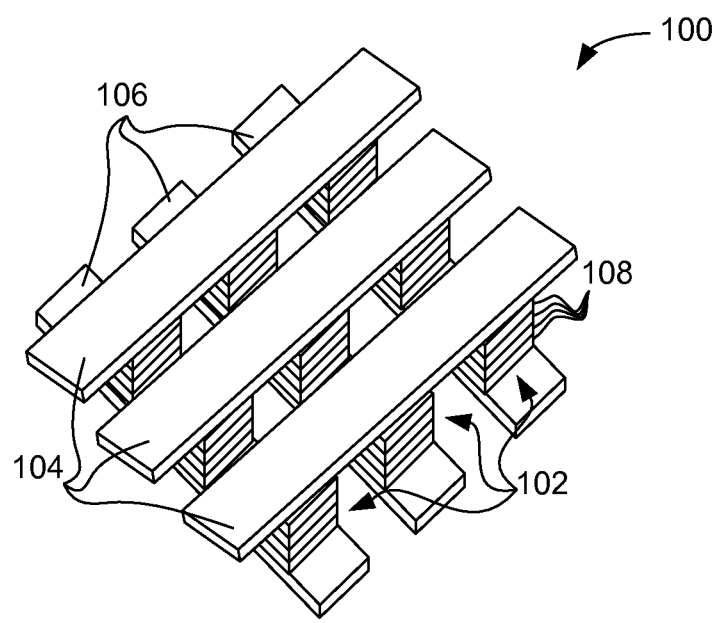
FIG. 1 illustrates a memory array of resistive switching memory elements.

FIG. 1 illustrates a memory array 100 of resistive switching memory elements 102. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

Figure 4A:
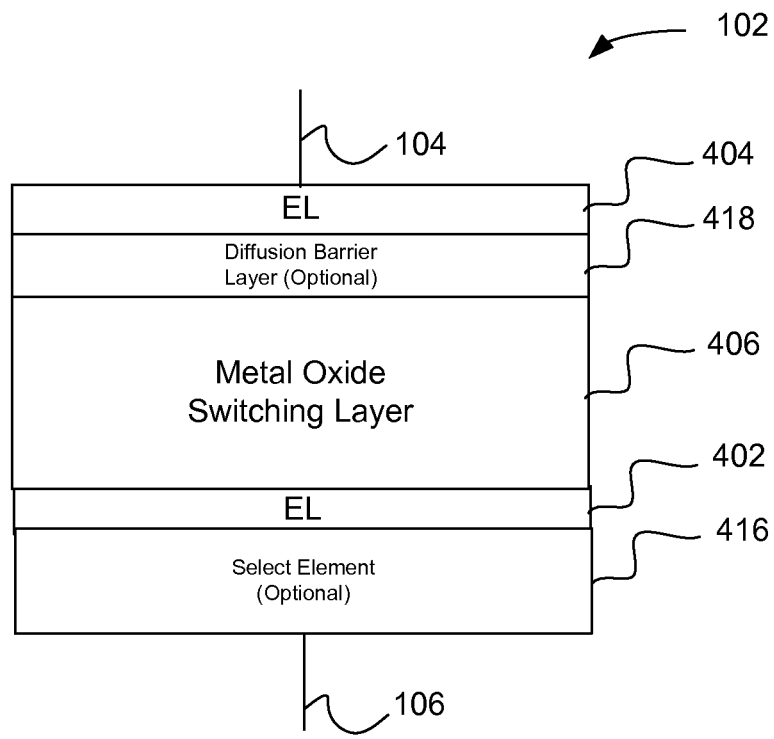
FIG. 4A illustrates a resistive-switching memory element including a doped silicon electrode.

If desired, other electrical devices may be associated (i.e. be one or more of the layers 108) with each memory element 102 (see, e.g. FIG. 4A). These devices, which are sometimes referred to as select elements, may include, for example, diodes, p-i-n diodes, silicon diodes, silicon p-i-n diodes, transistors, etc. Select elements may be connected in series in any suitable locations in memory element 102.

II. Memory Operation

During a read operation, the state of a memory element 102 can be sensed by applying a sensing voltage (i.e. a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e. a "1" bit). If, on the other hand, the memory element has a high resistance, the memory element may be said to contain a logic zero (i.e. a "0" bit). During a write operation, the state of a memory element can be changed by application of suitable write signals to an appropriate set of signal lines 104 and 106.

Figure 2A:
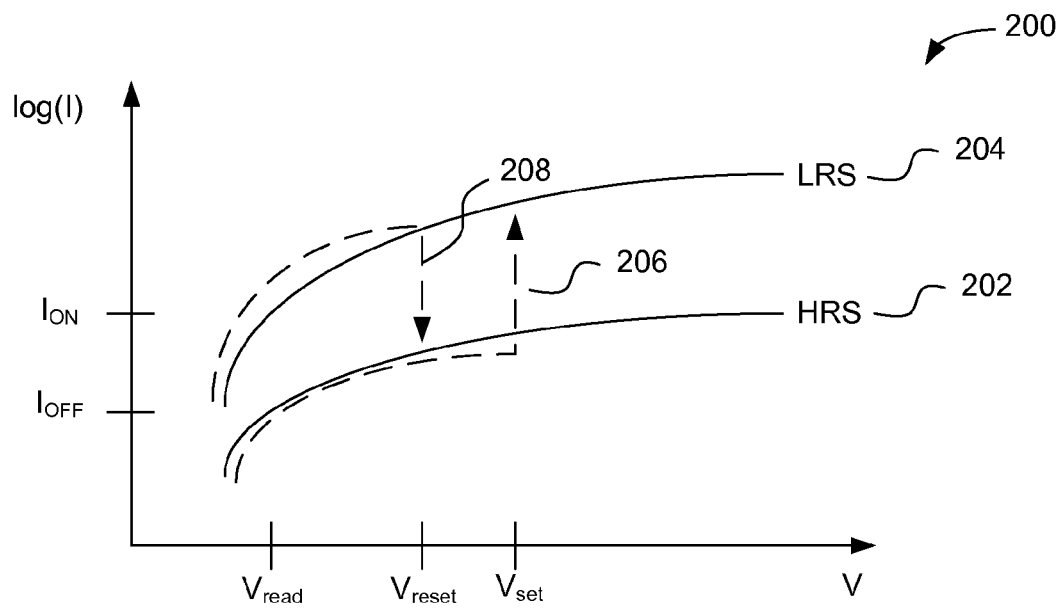
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g. storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, the change in the resistive state of memory element 102 may be because of the filling of traps (i.e. a may be "trap-mediated") in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses (see FIG. 4B) can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile. As can be appreciated, it is desirable for memory element 102 to have a large difference between off current and on current (i.e. a high $I_{ON}/I_{OFF}$ ratio), which causes the on and off states of the memory element to be more discrete and easily detectable.

III. Switching Mechanisms

A. Bulk-Mediated Switching

In its most basic form, the layers 108 of the memory element 102 include two electrodes (each having one or more materials and/or layers) and one or more layers of one or more metal oxides disposed in between. The memory element 102 generally has a metal-insulator-semiconductor (MIS)-style capacitor structure, although other structures which may include multiple layers of semiconductor may be used with the embodiments described herein.

Without being bound by theory, the memory element 102 uses a switching mechanism that is mediated in the bulk of a layer of the metal oxide. In one embodiment, the switching mechanism uses non-metallic conductive paths rather than filamentary or metallic conductive paths. Generally, defects are formed in, already exist in the deposited metal oxide, and existing defects can be enhanced by additional processes. Defects may take the form of variances in charge in the structure of the metal oxide. For example, some charge carriers may be absent from the structure (i.e. vacancies) or additional charge carriers may be present (i.e. interstitials), or one element may be substituted for another (i.e. substitutionals). Therefore, by applying a voltage to the memory element 102, the defects, such as traps, can either be filled or emptied to alter the resistivity of a metal oxide and resistive switching memory elements can be formed using these principles.

With unipolar switching polarity, it can be shown that the set voltage is dependent on the thickness of the metal oxide layer (see discussion regarding FIGS. 3A-3C) which indicates a bulk-mediated switching mechanism. Generally, the bulk-mediated switching mechanism forms percolation paths through the bulk of the metal oxide.

The metal oxides have any phase (e.g. crystalline and amorphous) or mixtures of multiple phases. The deposited metal oxides can have impurities (i.e. substitutional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

Figure 2B:
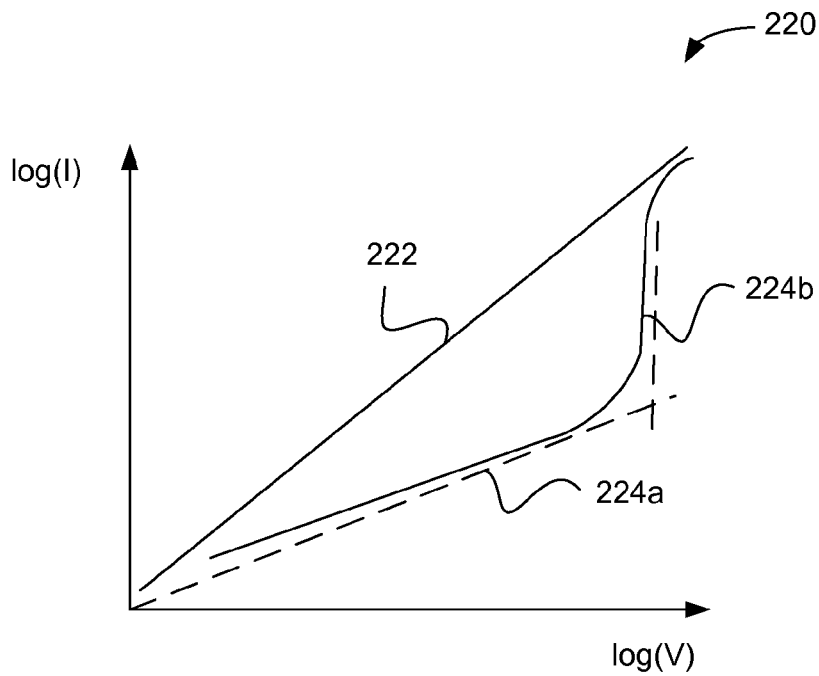
FIG. 2B is a logarithm of current (I) versus logarithm voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt response like graph 224 is desired. The graph 224 begins with an Ohmic response 224a, and then curves sharply upward 224b. The graph 224 may represent a set operation, where the memory element 102 switches from the HRS 202 to the LRS 204.

Without being bound by theory, non-metallic percolation paths are formed during a set operation and broken during a reset operation. For example, during a set operation, the memory element 102 switches to a low resistance state. The percolation paths that are formed by filling traps increase the conductivity of the metal oxide, thereby reducing (i.e. changing) the resistivity. The voltage represented by 224b is the set voltage. At the set voltage, the traps are filled and there is a large jump in current as the resistivity of the metal oxide decreases.

The set voltage shown here is very discrete (i.e. vertical), which is desirable to ensure the switching of the memory element occurs at a repeatable voltage. Additionally, a high ratio of on current to off current (i.e. a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and switching voltages in order to avoid damage to the memory elements and to be compatible with complementary device elements (see FIG. 4A) such as diodes and/or transistors in series with the memory element 102.

The percolation paths can be described as non-metallic. With metallic materials, resistivity decreases with lower temperature. The memory elements 102 described herein demonstrate an increase in resistance (e.g. the LRS) with decreases in operating temperatures.

B. Defects

The metal oxide includes electrically active defects (also known as traps) in the bulk. It is believed that the traps can be filled by the application of the set voltage, and emptied by applying the reset voltage. Traps can be inherent in the metal oxide (i.e. existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer.

A metal oxide may include defects that are the result of the process used to form the metal oxide. In other words, the defects may be inherent in the metal oxide. For example, physical vapor deposition (PVD) processes and atomic layer deposition (ALD) processes deposit layers that will always have some imperfections or flaws. These imperfections can generally be referred to as defects in the structure of the metal oxide. The defects can be used to create localized charge variances that can be filled and emptied by applying voltage pulses to the metal oxides. Defects can also be created by doping using processes such as ion implantation, or by doping using adjacent layers via interdiffusion. Other processes (e.g. annealing) can be used to change and/or enhance defects of a metal oxide to improve resistive switching characteristics.

C. Scaling and Bandgap

Figure 3A:
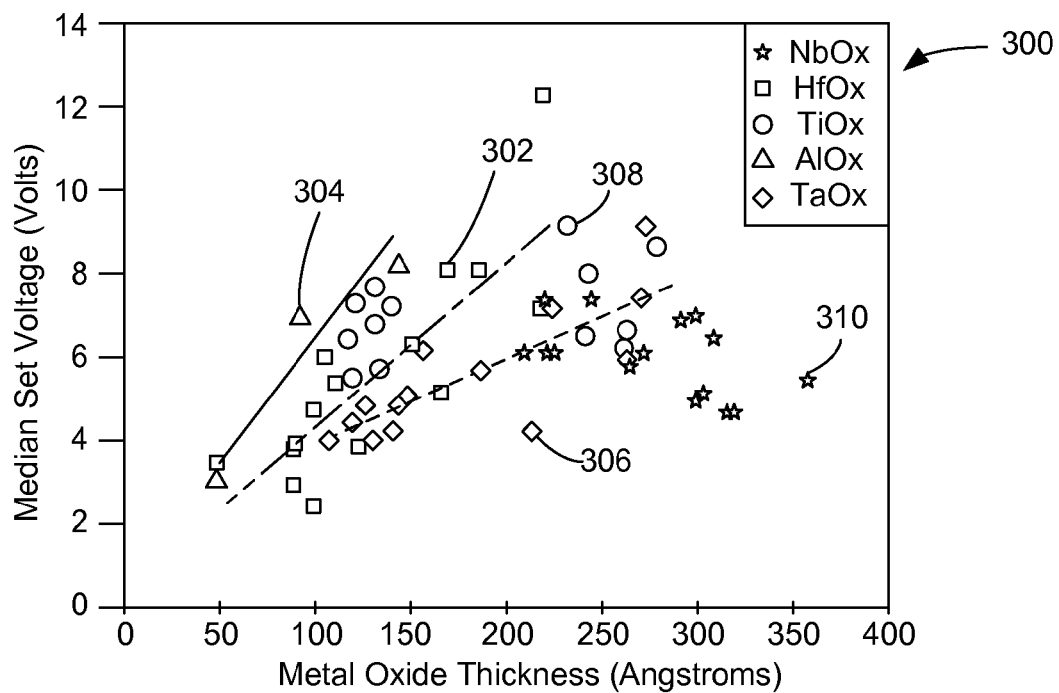
FIGS. 3A-3C are graphs showing the relationship between thicknesses of a metal oxide layer and resulting set voltages, reset voltages, and on/off current ratios for several materials systems used in memory elements described herein.
Figure 3B:
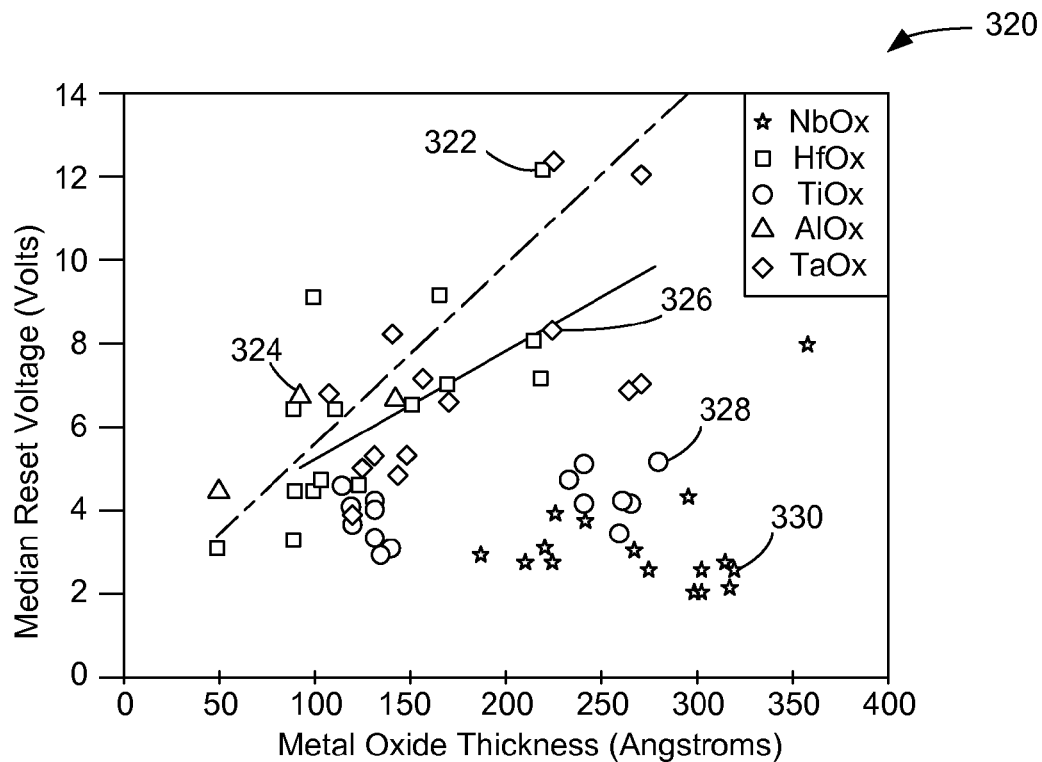
Figure 3C:
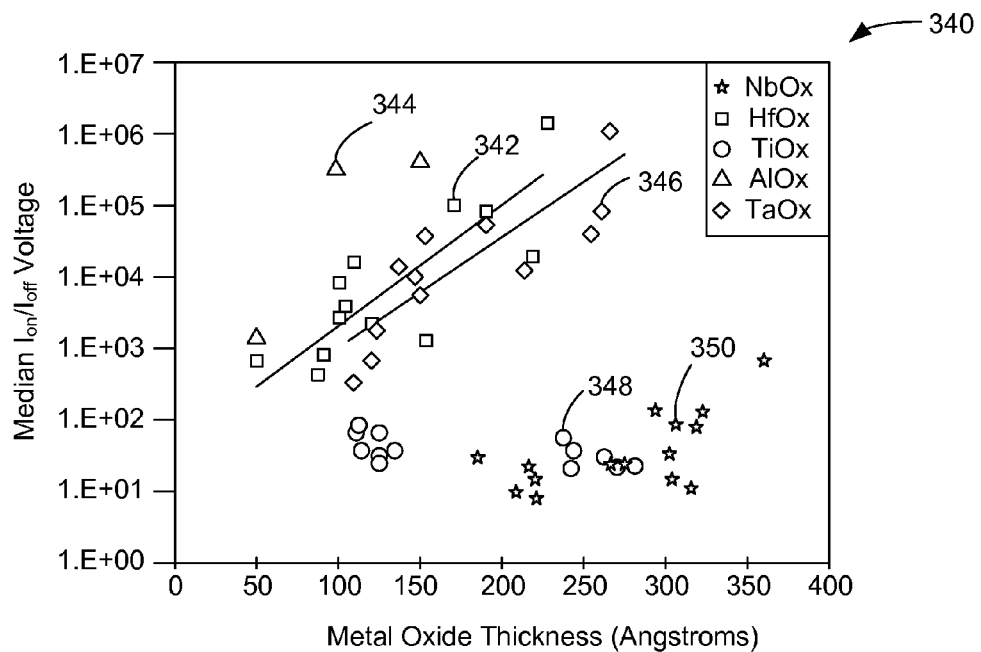

FIGS. 3A-3C are graphs showing the relationship between thicknesses of a metal oxide layer and resulting set voltages, reset voltages, and on/off current ratios for several materials systems used in memory elements described herein. These graphs show that switching properties such as on/off current ratios and set and reset voltages scale with thickness and exhibit bulk-mediated switching only for a certain class of materials (those having a bandgap greater than 4 eV). These graphs illustrate the characteristics of a memory element that includes two electrodes and a single layer of metal oxide disposed in between, and the results were obtained using unipolar switching pulses. As can be seen in FIG. 3A, for memory elements including hafnium oxide 302, aluminum oxide 304, or tantalum oxide 306, set voltage increases with (i.e. is dependent on) thickness, and in some embodiments and for these materials the set voltage is at least one volt (V) per one hundred angstroms (Å) of the thickness of a metal oxide layer in the memory element. In some embodiments, an increase in the thickness of the metal oxide layer of 100 Å increases the set voltage by at least 1V. Similarly, as shown in FIG. 3B, reset voltage for hafnium oxide 322, aluminum oxide 324, or tantalum oxide 326 also depends on thickness. These data therefore support a bulk-controlled set/reset mechanism for these materials, since a linear relationship indicates the formation of percolation paths throughout the bulk of the metal oxide. In other words, for a thicker material, more voltage is needed to fill the traps.

Hafnium oxide (5.7 electron volts (eV)), aluminum oxide (8.4 eV) and tantalum oxide (4.6 eV) all have a bandgap greater than 4 eV, while titanium oxide (3.0 eV) and niobium oxide (3.4 eV) have bandgaps less than 4 eV. Other higher bandgap metal oxides that can be used with various embodiments described herein include yttrium oxide, lanthanum oxide, and zirconium oxide. As shown in FIGS. 3A and 3B, set voltages for titanium oxide 308 and niobium oxide 310 and reset voltages for titanium oxide 328 and niobium oxide 330 do not increase with thickness. Therefore, a higher bandgap (i.e. bandgap greater than 4 eV) metal oxide exhibits bulk mediated switching and scalable set and reset voltages. In other words, set and reset voltages can be reduced by reducing the thickness of the high bandgap metal oxides such as hafnium oxide. Therefore, for smaller devices, set and reset voltages can be lowered.

FIG. 3C shows a relationship between the $I_{ON}/I_{OFF}$ ratio and the thickness of a metal oxide layer. Metal oxides that have bandgaps greater than 4 eV (i.e. hafnium oxide 342, aluminum oxide 344, and tantalum oxide 346, as well as other higher-bandgap materials such as zirconium oxide and yttrium oxide) show a scaling relationship between ON/OFF ratio and thickness. Additionally, for increasing bandgap, the $I_{ON}/I_{OFF}$ ratio increases. Conversely, materials having a bandgap less than 4 eV (i.e. titanium oxide 348 and niobium oxide 350) exhibit an $I_{ON}/I_{OFF}$ ratio that is independent of oxide thickness. Additionally, the higher bandgap materials generally have higher $I_{ON}/I_{OFF}$ ratios, which improve the ability to distinguish between the off state and the on state of the memory element.

Figure 3D:
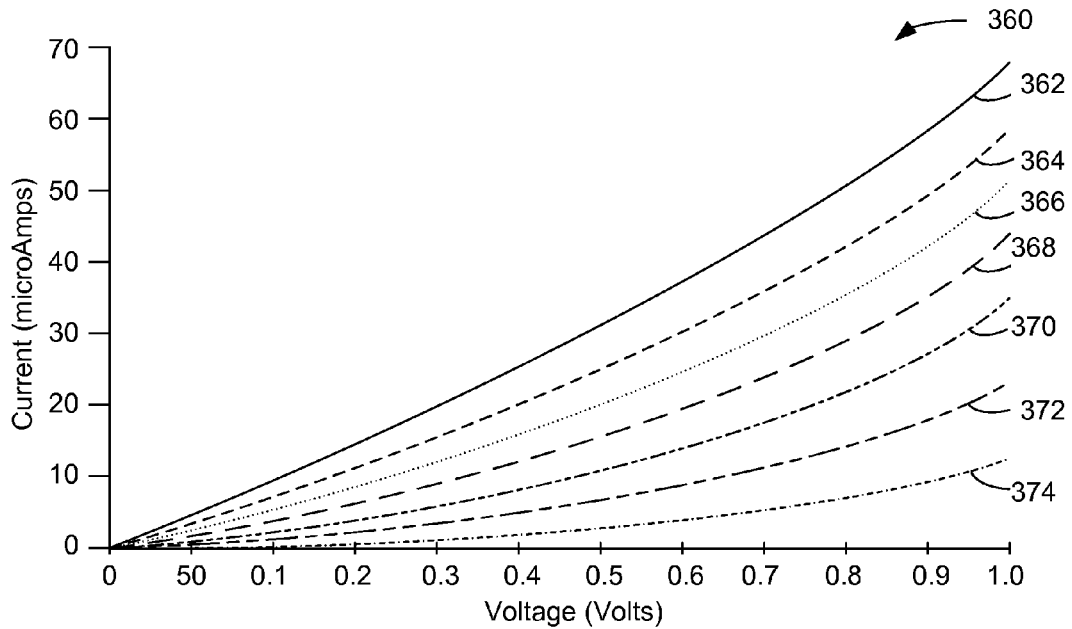
FIG. 3D is a graph that illustrates a non-metallic nature of metal oxides used for the memory elements described herein.

FIG. 3D is a graph 360 that illustrates a non-metallic nature of metal oxides used for the memory elements described herein. The graph 360 shows increasing resistivity for a high-bandgap (i.e. greater than 4 eV) oxide layer with decreasing temperatures, which is a characteristic of a non-metallic material. The graph 360 shows a sweep in voltage on the x-axis versus current on the y-axis. As can be seen the measurements 362 taken at 300 Kelvin (K) show the greatest current output, and thus lowest resistivity. The measurements 364 taken at 250K, 366 taken at 150K, 368 taken at 100K, 370 taken at 60K, 372 taken at 50K, and 374 taken at 10K show increasing resistivity (i.e. lower current) as the temperature decreases. This is a characteristic of non-metallic materials; some embodiments described herein include metal oxides that exhibit non-metallic switching mechanisms.

IV. Memory Element Structure and Materials

FIG. 4A illustrates a memory element 102. Memory element 102 may be, as described above, an MIS-style stack including one or multiple insulating layers between two electrodes 402 and 404. For example, a metal oxide switching layer 406 may be a high bandgap (e.g. greater than 4 eV) metal oxide such as hafnium oxide, tantalum oxide, lanthanum oxide, zirconium oxide, aluminum oxide, or yttrium oxide. The metal oxide switching layer can be deposited using any known technique, including dry (PVD, ALD, CVD) and wet (electroless deposition, electrochemical deposition) deposition techniques. The metal oxide switching layer 406 may operate via bulk-mediated switching mechanisms (see e.g. FIG. 3A).

A. Electrodes

The electrodes 402 and 404 include materials having different work functions. The electrodes 402 and 404 have work functions that are different by between 0.1 and 1.0 eV, or by 0.4 to 0.6 eV. One electrode therefore has a relatively low work function, while the other electrode has a relatively high work function. One electrode is further doped silicon, for example doped polysilicon, monocrystalline silicon, or amorphous silicon. The silicon electrode may be n-type or p-type doped silicon having a doping level greater than 0.2 atomic percent (i.e. the electrode includes more than 0.2 atomic percent of a dopant). Dopants may include phosphorous or arsenic for n-type doping or boron for p-type doping. Doping can be performed using ion implantation or another suitable technique. Work functions for n-type doped silicon electrodes may range from 4.1-4.15 eV, while work functions for p-type doped silicon electrodes may range from 4.9-5.3 eV. A material that can be used for the other electrode is titanium nitride, which has a work function of approximately 4.5-4.6 eV. Therefore, either n-type or p-type silicon electrodes have a work function that is different from titanium nitride by between 0.1 eV and 1.0 eV, or by between 0.4 and 0.6 eV. One advantage of doped silicon or polysilicon electrodes is that they do not oxidize in a nonuniform manner. Other electrode materials can include tantalum nitride (4.7-4.8 eV), molybdenum oxide (5.1 eV), molybdenum nitride (4.0-5.0 eV), and tungsten (4.5-4.6 eV).

Figure 4B:
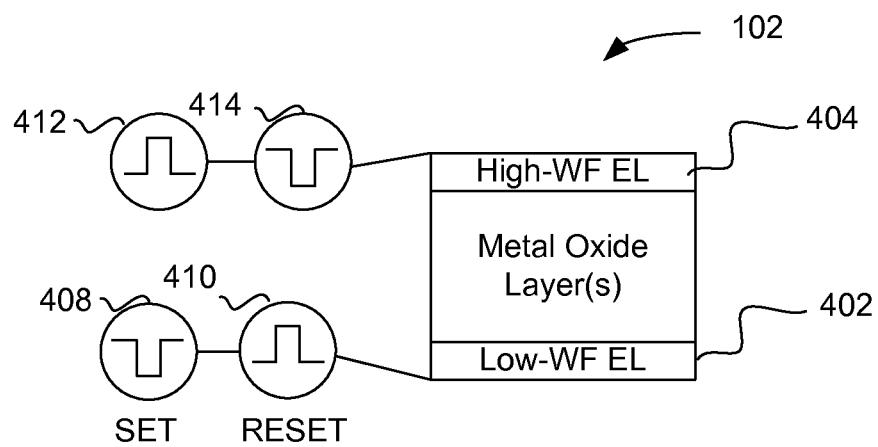
FIG. 4B illustrates the polarity of switching pulses for a resistive-switching memory element.

The polarity of the set and reset voltages also affects the cycling yield when using a doped silicon electrode. As used herein, cycling yield refers to the number of memory elements that continue to switch after a specified number of cycles (e.g. 100 cycles). With the doped silicon electrode, bipolar switching voltages show improved cycling yields. FIG. 4B illustrates the polarity of switching pulses. The memory elements described herein can be switched using bipolar switching pulses. For example, assuming that the electrode 404 is the relatively high work function electrode (e.g. is TiN), and that the electrode 402 is the relatively low work function electrode (e.g. is n-type polysilicon), then the low work function electrode 402 should be negative during the set pulse 408 and positive during the reset pulse 410, and the higher work function electrode 404 should be positive during the set pulse 412 and negative during the reset pulse 414.

Figure 5A:
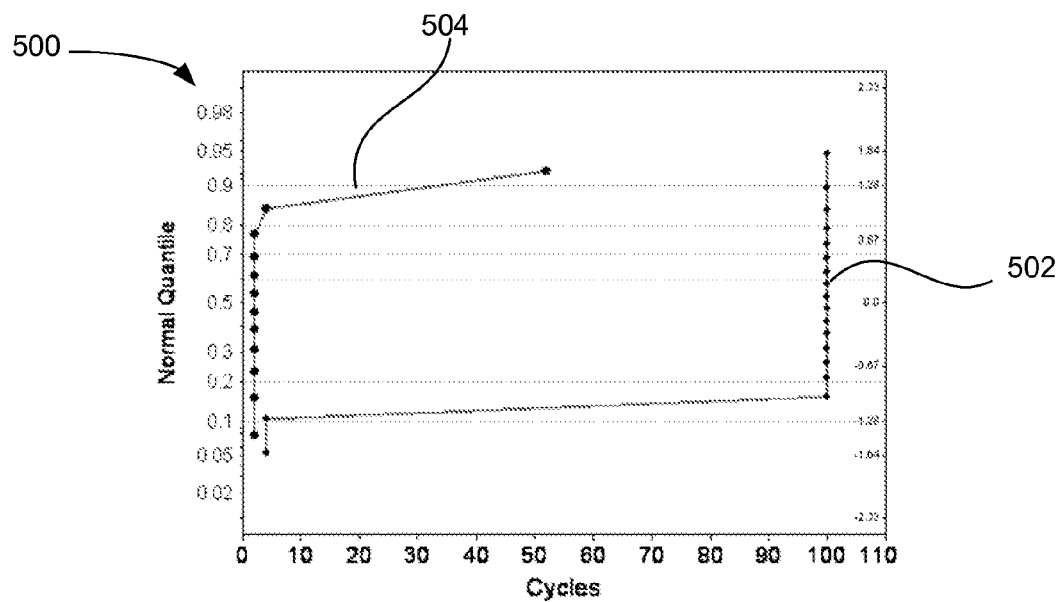
FIG. 5A is a graph showing high cycling yield when the low work function electrode of the resistive-switching memory element receives a negative voltage set pulse and positive voltage reset pulse.

FIG. 5A is a graph 500 showing high cycling yield when the low work function electrode receives a negative voltage set pulse and positive voltage reset pulse. The memory element configuration includes an n-type polysilicon electrode 402, an atomic layer deposition (ALD)-deposited hafnium oxide switching layer 406, an ALD-deposited titanium oxide coupling layer 418 and a physical vapor deposition (PVD)-deposited titanium nitride electrode 404. The plot 502 reflects memory elements in which the lower work function electrode (here, the n-type polysilicon electrode) receives a negative voltage set pulse and a positive voltage reset pulse relative to a common electrical reference. The common electrical reference can be any voltage, such as ground, +2V, etc. An electrode is said to receive a voltage if that voltage is visible at the electrode; for example the polysilicon electrode 402 may see a positive reset voltage even if the voltage pulse originates elsewhere.

As can be seen in the plot 502, approximately 85% of the memory elements in which the lower work function electrode receives a negative voltage set pulse last to 100 cycles. In contrast, the plot 504 reflects memory elements in which the lower work function electrode receives a positive voltage set pulse and a negative voltage reset pulse. As can be seen, none of these memory elements survive past 60 cycles, and very few survive to 10 cycles. It can be surmised then that when using the memory elements described herein, the lower work function electrode should receive a negative voltage set pulse and a positive voltage reset pulse.

Figure 5B:
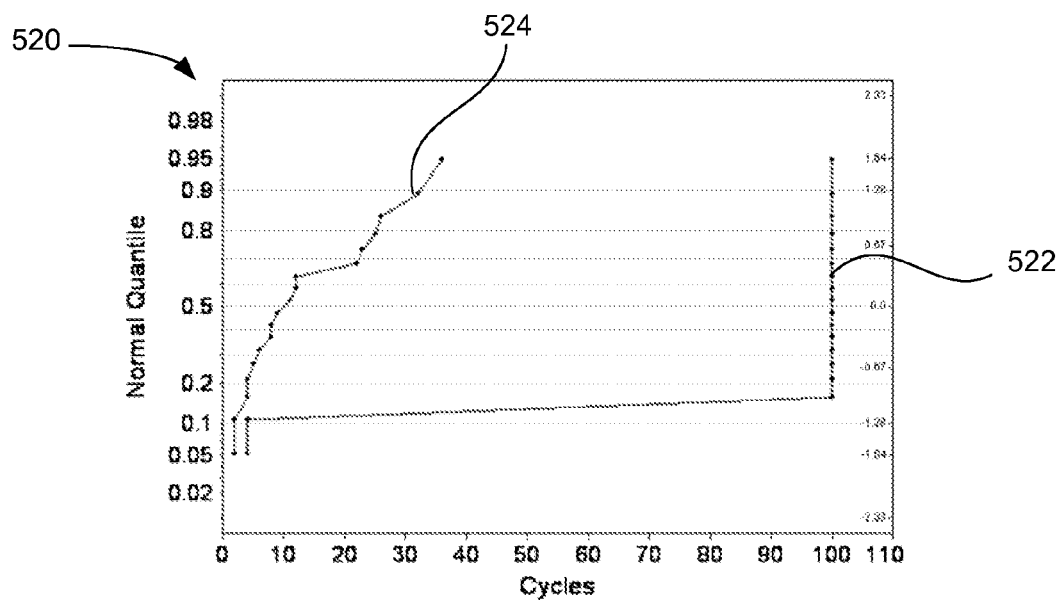
FIG. 5B is a graph showing high cycling yield when two electrodes of a resistive-switching memory element have work functions that are different by greater than 0.1 eV but less than 1.0 eV.

FIG. 5B is a graph 520 showing high cycling yield when two electrodes have work functions that differ by between 0.1 eV and 1.0 eV. Memory elements that include electrodes 404 and 402 having work functions that differ by more than 0.1 eV but less than 1.0 eV show high cycling yield compared to memory elements that include electrodes having work functions that differ by more than 1.0 eV. The graph 520 shows cycling yields for two memory element configurations represented by plots 522 and 524. The configuration represented by plot 522 includes an n-type polysilicon electrode 402, a hafnium oxide layer 406, a titanium oxide layer 418, and a titanium nitride electrode 404. N-type polysilicon has a work function of approximately 4.1 eV while titanium nitride has a work function of approximately 4.5-4.6 eV, giving a difference of approximately 0.4-0.5 eV. The configuration represented by plot 524 includes an n-type polysilicon electrode 402, a hafnium oxide switching layer 406, a titanium oxide layer 418, and a platinum electrode 404. N-type polysilicon has a work function of approximately 4.1 eV while platinum has a work function of approximately 5.7 eV, giving a difference of approximately 1.6 eV. As can be seen, the plot 522 shows high cycling yield, while the plot 524 shows low cycling yield, indicating electrodes used in memory elements described herein are more effective when they have work function differences of less than 1.0 eV.

B. Other Memory Element Components

The memory element 102 may include other functional layers or components as shown in FIG. 4A. For example, the memory element 102 may optionally include a select element 416 or a coupling layer 418.

The select element 416 can be used to select the memory element 102 when the memory element 102 is one of several memory elements in a memory array 100. The select element 416 may be, for example, a diode such as a n-p, p-n, p-i-n, or an n-i-p diode. In other embodiments, the select element 416 can be located outside of the memory element 102, for example the select element 416 can be a transistor that is connected to the memory element 102 through a contact plug.

The other optional layer is the coupling layer 418. The coupling layer 418 may be, for example, a layer including a same metal as the electrode 404 (i.e. the electrode that the coupling layer 418 is in contact with). In some embodiments, the most prevalent metal in the coupling layer 418 may be the same as the most prevalent metal in the electrode 404. For example, if the electrode 404 is titanium nitride, the coupling layer 418 could be titanium oxide. In other embodiments, the coupling layer 418 could be aluminum oxide or zirconium oxide. It is believed that for some configurations, having a coupling layer including the same metal as an adjacent electrode can prevent diffusion between the electrode and the switching metal oxide layer. Additionally, the coupling layer 418 can create or modify defects at an interface near the electrode 404. As described below, cycling yield can improve with a coupling layer 418. In some embodiments, the coupling layer 418 is less than 25% as thick as the metal oxide switching layer 406. For example, the metal oxide switching layer may be between 20 and 80 Å thick, while the coupling layer 418 is between 5 and 10 Å thick.

Cycling yield has been shown to improve with increased thickness of the higher-bandgap material (i.e. materials with a bandgap greater than 4 eV) and a coupling layer. Table 1 lists the cycling yield for several memory elements that were evaluated using bipolar switching where the lower work function electrode is positive during the set pulse. For each configuration, 18 elements were tested, and each memory element includes an n-type polysilicon electrode beneath the metal oxide switching layer and a titanium nitride electrode above the coupling layer. As can be seen, the highest cycling yield is for those memory elements that include a 50 Å thick hafnium oxide layer and a 5 Å thick titanium oxide layer, although other combinations (e.g. the 70 Å hafnium oxide layer) also show acceptable results.

TABLE 1

| Metal Oxide Switching Layer | | Coupling Layer | | Cycling |
|---|---|---|---|---|
| Material | Thickness | Material | Thickness | Yield |
| $HfO_2$ | 20 Å | None | None | 29.3% |
| $HfO_2$ | 50 Å | None | None | 32.2% |
| $HfO_2$ | 70 Å | None | None | 51.7% |
| $HfO_2$ | 30 Å | $TiO_2$ | 5 Å | 35.1% |
| $HfO_2$ | 50 Å | $TiO_2$ | 5 Å | 89.3% |

Memory elements in which the thickness of the metal oxide layer is more than 80% of the total thickness of the metal oxide layer and the coupling layer can show improved cycling yield. For example, the memory elements that includes a 50 Å hafnium oxide layer and a 5 Å titanium oxide layer includes more than 80% hafnium oxide by thickness and shows high cycling yield. By contrast, the memory elements that includes a 30 Å hafnium oxide layer and a 5 Å titanium oxide layer includes less than 80% hafnium oxide by thickness and show low switching yield. Therefore, the presence of higher bandgap (i.e. greater than 4 eV) materials leads to improved switching characteristics.

Additionally, another memory element design includes an MIS-style stack having a doped polysilicon bottom electrode, a 5 Å titanium oxide layer adjacent to the polysilicon electrode, and a 50 Å hafnium oxide layer between the titanium oxide layer and a titanium nitride top electrode. This design showed a cycling yield of 33.3% (6 of 18 devices surviving 100 cycles), illustrating that the arrangement of metal oxide layers within the memory element can affect device survival.

Other higher bandgap materials (e.g. TaOx, AlOx, LaOx, ZrOx, YOx) can substitute or supplement the hafnium oxide in the table above and show good results. For example, the hafnium oxide layer can be replaced with an aluminum oxide layer, a lanthanum oxide layer, a hafnium aluminum oxide layer, or a hafnium lanthanum oxide layer.

V. Memory Element Fabrication

Figure 6:
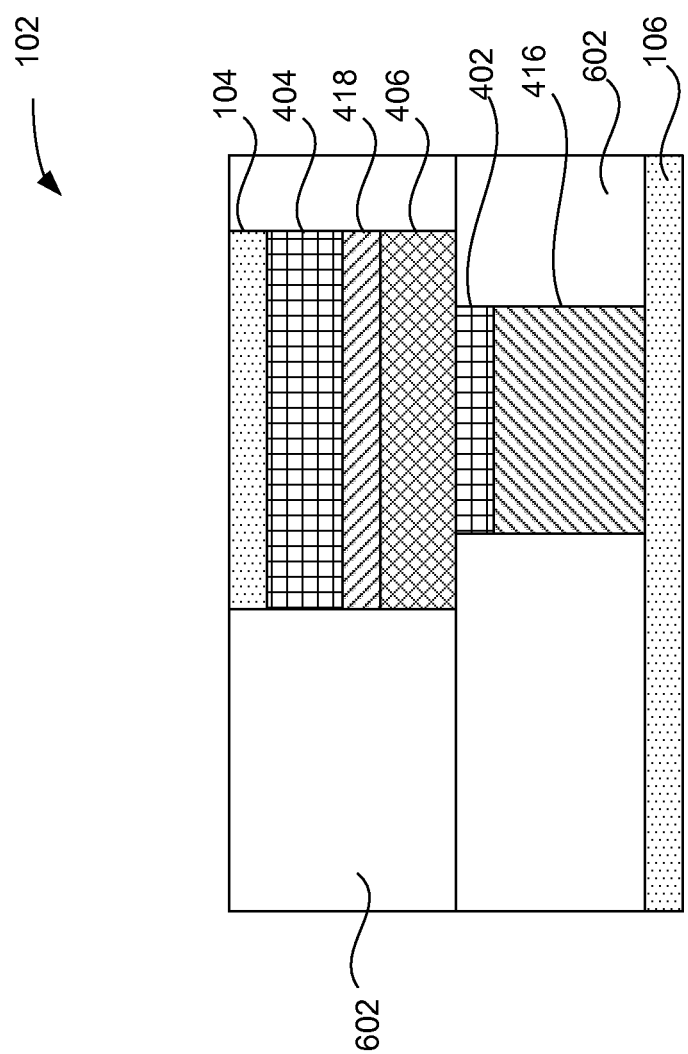
FIG. 6 illustrates an exemplary integration scheme for a resistive-switching memory element.
Figure 7:
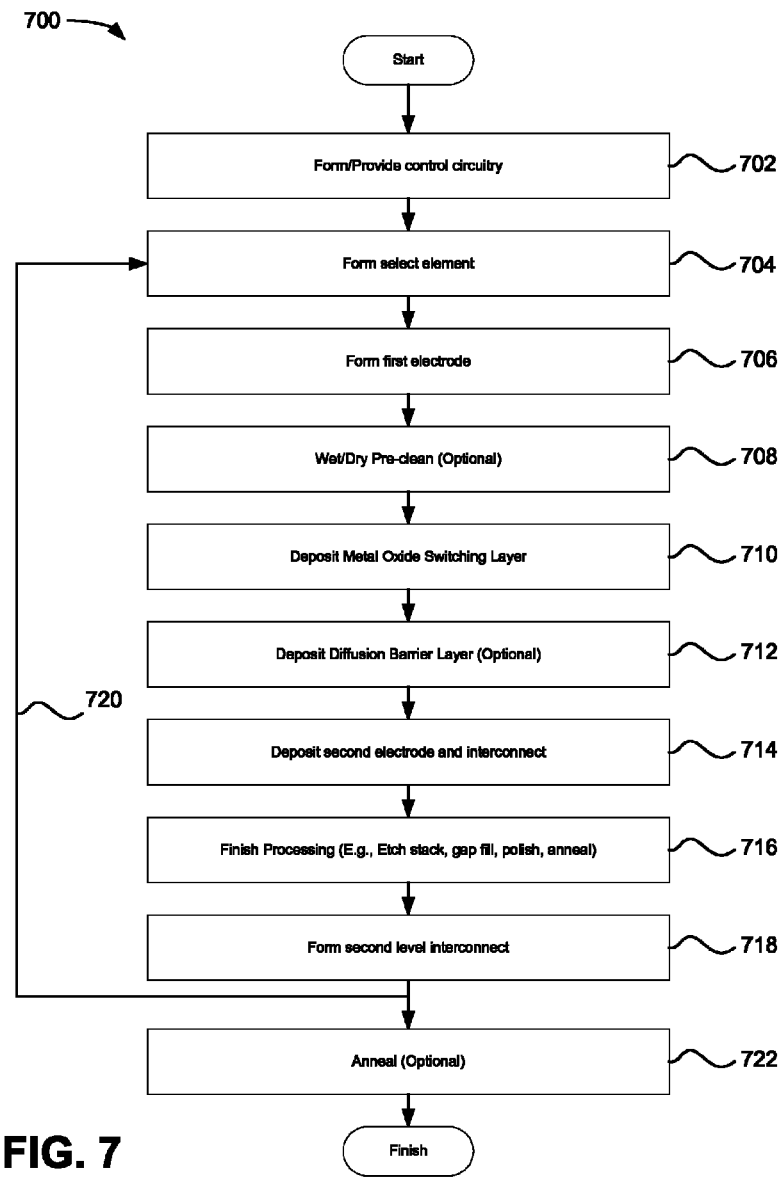
FIG. 7 is a flowchart describing a process for forming a resistive-switching memory element.

FIG. 6 illustrates an exemplary integration scheme for the memory element 102. FIG. 6 shows how the memory element 102 could be integrated into a memory array such as memory array 100. FIG. 7 is a flowchart describing a process 700 for forming the memory element 102.

In operation 702, control circuitry is formed or provided. For example, control circuitry can include word lines and bit lines such as signal line 106. In operation 704, a select element 416 is formed. The select element 416 can be any type of select element, for example a diode such as a p-n, n-p, p-i-n, or n-i-p diode. The select element 416 is optionally formed, and in other embodiments can be located elsewhere within or without memory element 102.

In operation 706, the first electrode 402 is formed. The first electrode 402 can be doped silicon, for example polysilicon or monocrystalline silicon or amorphous silicon. The electrode 402 can be formed using any appropriate technique, such as chemical vapor deposition (CVD) or ALD, and can be doped using appropriate techniques such as ion implantation. The silicon electrode is doped with at least 0.2 atomic percentage of dopant, and can be either n-type or p-type doped silicon.

In operation 708, an optional pre-clean is performed. The pre-clean can be either a wet or a dry pre-clean. In operation 710, the metal oxide switching layer 406 is deposited. The metal oxide switching layer can be, for example, a layer having a bandgap greater than 4 eV, and can be formed using any appropriate technique, such as physical vapor deposition (PVD), CVD, ALD, etc. Examples of materials for the metal oxide switching layer include hafnium oxide, lanthanum oxide, aluminum oxide, and tantalum oxide. The metal oxide switching layer can have any appropriate thickness, for example between 10 and 500 Å.

In operation 712, an optional coupling layer 418 is deposited. The optional coupling may, have a metal in common with the second electrode 404. For example, the second electrode, which is deposited in operation 714, may be titanium nitride, while the coupling layer is titanium oxide. The coupling layer 418 and the second electrode 404 can be deposited using any appropriate technique, such as PVD, ALD, CVD, etc. In operation 714 an interconnect such as signal line 104 can also be deposited.

In operation 716, the processing of the memory element 102 is finished. Operation 716 may include etching the memory element 102, filling the gaps with an interlayer dielectric 602 (e.g. silicon dioxide), and polishing the memory element 102 (e.g. using chemical mechanical planarization (CMP)). Operation 716 may also include an optional anneal.

In operation 718, a second level of interconnect is formed on top of the memory element 102. The second level of interconnect may be used to connect another memory element above memory element 102. The operations 704-718 can then be repeated 720 to form another memory element. Once all of the memory elements have been fabricated, in operation 722, the stack can be optionally annealed.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A non-volatile resistive-switching memory element comprising:
    a first electrode having a first work function wherein the first electrode comprises doped silicon;
    a second electrode having a second work function differing from the first work function of the first electrode by between 0.1 and 1.0 electron volts (eV); and
    a metal oxide switching layer provided between the first electrode and the second electrode, the metal oxide switching layer being configured to switch between a low resistance state and a high resistance state based on bulk-mediated switching.

2. The non-volatile resistive-switching memory element of claim 1, wherein the doped silicon is one of doped polysilicon, doped monocrystalline silicon, and doped amorphous silicon.

3. The non-volatile resistive-switching memory element of claim 1, wherein the second electrode comprises one of tantalum nitride, molybdenum oxide, molybdenum nitride, and tungsten.

4. The non-volatile resistive-switching memory element of claim 1, wherein the first electrode comprises doped polysilicon and the second electrode comprises titanium nitride.

5. The non-volatile resistive-switching memory element of claim 4, wherein the doped polysilicon of the first electrode comprises p-doped polysilicon.

6. The non-volatile resistive-switching memory element of claim 5, wherein the metal oxide switching layer comprises hafnium oxide.

7. The non-volatile resistive-switching memory element of claim 6, further comprising a coupling layer provided between the metal oxide switching layer and the second electrode.

8. The non-volatile resistive-switching memory element of claim 7, wherein the coupling layer comprises titanium oxide.

9. The non-volatile resistive-switching memory element of claim 8, wherein the coupling layer has a thickness less than 25% of a thickness of the metal oxide switching layer.

10. The non-volatile resistive-switching memory element of claim 1, wherein the metal oxide switching layer has a bandgap of greater than 4 eV.

11. The non-volatile resistive-switching memory element of claim 1, wherein the metal oxide switching layer comprises one of lanthanum oxide, hafnium oxide, zirconium oxide, yttrium oxide, tantalum oxide, and aluminum oxide.

12. The non-volatile resistive-switching memory element of claim 1, wherein the metal oxide switching layer has one of a crystalline phase and an amorphous phase.

13. The non-volatile resistive-switching memory element of claim 1, wherein the metal oxide switching layer has an amorphous phase.

14. The non-volatile resistive-switching memory element of claim 1, wherein the metal oxide switching layer comprises hafnium oxide and aluminum impurities.

15. The non-volatile resistive-switching memory element of claim 1, wherein the first work function of the first electrode differs from the second work function of the second electrode by between 0.4 and 0.6 electron volts (eV).

16. The non-volatile resistive-switching memory element of claim 1, wherein the first work function of the first electrode is greater than the second work function of the second electrode, and wherein the second electrode is configured to receive a lower potential relative to the first electrode during set pulsing and/or is configured to receive a higher potential relative to the first electrode during reset pulsing.

17. A non-volatile resistive-switching memory element comprising:
    a p-doped polysilicon electrode;
    a titanium nitride electrode; and
    a metal oxide switching layer provided between the p-doped polysilicon electrode and the titanium nitride electrode, the metal oxide switching layer is configured to switch between a low resistance state and a high resistance state based using bulk-mediated switching.

18. A non-volatile resistive-switching memory element comprising:
    a first electrode comprising doped silicon and having a first work function;
    a second electrode having a second work function differing from the first work function of the first electrode by between 0.1 and 1.0 electron volts (eV); and
    a metal oxide switching layer provided between the first electrode and the second electrode, the metal oxide switching layer comprises one or more materials selected from the group consisting of hafnium oxide, tantalum oxide, lanthanum oxide, aluminum oxide, zirconium oxide, and yttrium oxide.

* * * * *